United States Patent
Zhao et al.

(10) Patent No.: US 11,984,456 B2
(45) Date of Patent: May 14, 2024

(54) ARRAY BASE PLATE AND MANUFACTURING METHOD THEREFOR

(71) Applicant: TCL China Star Optoelectronics Technology Co., Ltd., Guangdong (CN)

(72) Inventors: Ling Zhao, Guangdong (CN); Weimin Chang, Guangdong (CN); Juncheng Xiao, Guangdong (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/600,406

(22) PCT Filed: Aug. 17, 2021

(86) PCT No.: PCT/CN2021/112988
§ 371 (c)(1),
(2) Date: Sep. 30, 2021

(87) PCT Pub. No.: WO2023/015579
PCT Pub. Date: Feb. 16, 2023

(65) Prior Publication Data
US 2024/0047479 A1    Feb. 8, 2024

(30) Foreign Application Priority Data
Aug. 9, 2021 (CN) .......................... 202110906895.5

(51) Int. Cl.
*H01L 23/00*    (2006.01)
*H01L 27/12*    (2006.01)

(52) U.S. Cl.
CPC ...... *H01L 27/1244* (2013.01); *H01L 27/1225* (2013.01); *H01L 27/1262* (2013.01); *H01L 27/127* (2013.01)

(58) Field of Classification Search
CPC ............. H01L 27/1244; H01L 27/1225; H01L 27/1262; H01L 27/127
See application file for complete search history.

(56) References Cited

U.S. PATENT DOCUMENTS

2009/0026463 A1    1/2009    Kang

FOREIGN PATENT DOCUMENTS

| CN | 107634086 | 1/2018 |
| CN | 108598135 | 9/2018 |
| CN | 109256400 | 1/2019 |
| CN | 109887416 | 6/2019 |
| CN | 112908985 | 6/2021 |
| CN | 113168046 | 7/2021 |

OTHER PUBLICATIONS

International Search Report and the Written Opinion Dated Apr. 13, 2022 From the International Searching Authority Re. Application No. PCT/CN2021/112988 and Its Translation Into English. (16 Pages).

*Primary Examiner* — Anthony Ho

(57) ABSTRACT

The present invention provides an array base plate and a manufacturing method therefor. The array base plate includes a substrate base plate layer, a first trace layer, an insulating layer, and a stress balance layer. The first trace layer includes a first trace. An edge of the stress balance layer is aligned to an edge of the substrate base plate layer. The stress balance layer has a bending stress in a direction opposite to a direction of the first trace and a curvature less than 1.2 mm/m.

20 Claims, 4 Drawing Sheets

ARRAY BASE PLATE AND MANUFACTURING METHOD THEREFOR

RELATED APPLICATIONS

This application is a National Phase of PCT Patent Application No. PCT/CN2021/112988 having International filing date of Aug. 17, 2021, which claims the benefit of priority of Chinese Patent Application No. 202110906895.5 filed on Aug. 9, 2021. The contents of the above applications are all incorporated by reference as if fully set forth herein in their entirety.

FIELD AND BACKGROUND OF THE INVENTION

The present invention relates to the display field, and in particular, to an array base plate and a manufacturing method therefor.

As smart mobile terminals develop rapidly, smart phones have increasingly few buttons.

SUMMARY OF THE INVENTION

With the advance of science and technology and the development of the times, people have increasingly high requirements for a display screen of a mobile phone. A current mainstream hard display screen no longer satisfies market requirements.

In the prior art, an array base plate includes a conductive layer structure, such as a data line or a gate line. At present, in order to increase a charge ratio (CR) of an 8K display device product to reduce a capacitance delay, a relatively thick conductive material is required to prepare the conductive layer structure, such as the data line or the gate line. However, a thicker material brings a larger stress. As a result, both a display area and an edge area of the array base plate prepared using glass are easily warped or even broken by a tensile stress of the conductive layer structure, such as the data line or the gate line.

Thus, it is urgent to resolve warping or even breaking of an array base plate caused by a tensile stress of a material by using which a conductive layer structure, such as a data line or a gate line is prepared.

The present invention is intended to provide an array base plate and a manufacturing method therefor, to resolve warping or even breaking of an array base plate caused by a tensile stress of a material by using which a conductive layer structure, such as a data line or a gate line is prepared.

In order to resolve the above problems, an embodiment of the present invention provides an array base plate. The array base plate includes a substrate base plate layer, a first trace layer, an insulating layer, and a stress balance layer. The first trace layer is disposed on the substrate base plate layer. The first trace layer includes a first trace. The insulating layer is disposed on the first trace layer and covers the first trace. The stress balance layer is disposed on the insulating layer and surrounds an edge of the substrate base plate layer. An edge of the stress balance layer is aligned to the edge of the substrate base plate layer. The stress balance layer has a bending stress in a direction opposite to a direction of the first trace and a curvature less than 1.2 mm/m.

According to the array base plate in an embodiment of the present disclosure, a material of the first trace layer includes copper (Cu). A thickness of the first trace is greater than or equal to 5500 angstroms. A material of the stress balance layer includes any of arsenic, polysilicon, SINx, SiQx, and IGZO. A thickness of the stress balance layer is greater than or equal to 900 angstroms.

According to the array base plate in an embodiment of the present disclosure, the stress balance layer covers the first trace.

According to the array base plate in an embodiment of the present disclosure, the array base plate is divided into a display area and a frame area surrounding the display area, and the stress balance layer is disposed in the frame area.

According to the array base plate in an embodiment of the present disclosure, the array base plate further includes a second trace layer and a passivation layer. The second trace layer is disposed on the stress balance layer. The passivation layer is disposed on the second trace layer.

Another embodiment of the present invention provides a method for manufacturing an array base plate. The method includes steps of:

manufacturing a plurality of sets of same first trace layer patterns on a substrate base plate layer, wherein each set of first trace layer patterns includes a first trace, and the plurality of sets of first trace layer patterns are arranged in an array and spaced apart from each other on the substrate base plate layer;

manufacturing an insulating layer to cover the plurality of sets of first trace layer patterns and the substrate base plate layer;

manufacturing a stress balance layer on the insulating layer, wherein the stress balance layer covers gap regions among the plurality of sets of first trace layer patterns and has a bending stress in a direction opposite to a direction of the first trace and a curvature less than 1.2 mm/m; and cutting the substrate base plate layer along the gap regions to form a plurality of array base plates.

According to the method for manufacturing an array base plate in an embodiment of the present disclosure, a material of the first trace layer patterns includes Cu. A thickness of the first trace is greater than or equal to 5500 angstroms. A material of the stress balance layer includes any of arsenic, polysilicon, SINx, SiQx, and IGZO. A thickness of the stress balance layer is greater than or equal to 900 angstroms.

According to the method for manufacturing an array base plate in an embodiment of the present disclosure, the stress balance layer covers the first trace.

The present disclosure further provides a method for manufacturing an array base plate. The method includes steps of:

manufacturing a plurality of sets of same first trace layer patterns on a substrate base plate layer, wherein each set of first trace layer patterns includes a first trace, and the plurality of sets of first trace layer patterns are arranged in an array and spaced apart from each other on the substrate base plate layer;

manufacturing an insulating layer to cover the plurality of sets of first trace layer patterns and the substrate base plate layer;

manufacturing a stress balance layer on the insulating layer, wherein the stress balance layer covers gap regions among the plurality of sets of first trace layer patterns and has a bending stress in a direction opposite to a direction of the first trace and a curvature less than 1.2 mm/m;

manufacturing a second trace layer pattern on the stress balance layer;

manufacturing a passivation layer on the second trace layer pattern; and cutting the substrate base plate layer along the gap regions to form a plurality of array base plates.

According to the method for manufacturing an array base plate in an embodiment of the present disclosure, the array base plate is divided into a display area and a frame area surrounding the display area, and the stress balance layer covers a range from the gap regions to the frame area.

Beneficial effects of the present invention are as follows. An array base plate and a manufacturing method therefor are provided. The stress balance layer is disposed in the gap regions and the frame area or on the first trace and/or the second trace. By means of a compressive stress of the material of the stress balance layer, a warping stress of the trace is balanced, thereby alleviating warping and breaking of the array base plate during preparation.

BRIEF DESCRIPTION OF THE SEVERAL VIEWS OF THE DRAWINGS

The following describes specific implementations of the present disclosure in detail with reference to the accompanying drawings, to make the technical solutions and other beneficial effects of the present disclosure obvious.

REFERENCE NUMERALS

Figure 1A:
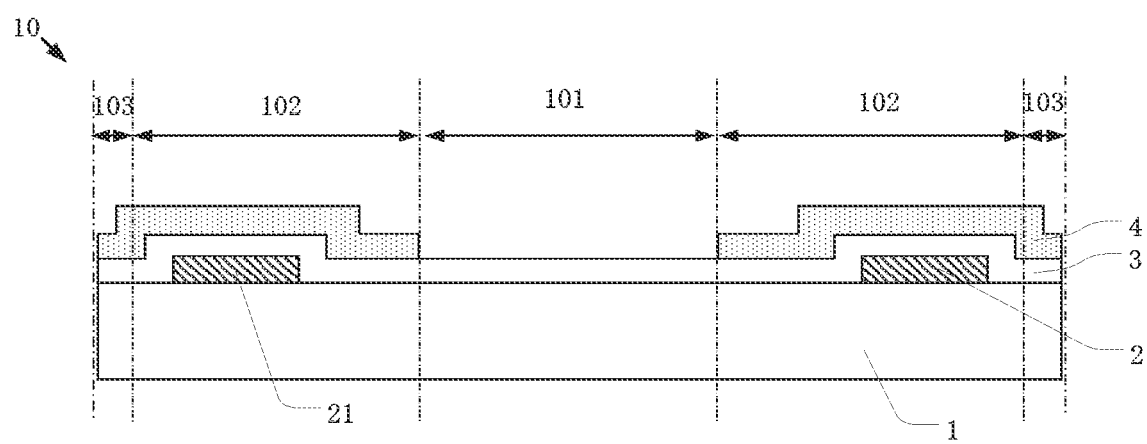
FIG. 1a is a schematic cross-sectional view of a structure of an array base plate according to an embodiment of the present invention.

Substrate base plate layer 1, First trace layer 2, Insulating layer 3,
Stress balance layer 4, Second trace layer 5, Passivation layer 6,
Array base plate 10, Large panel structure 11, Small panel structure 12,
First trace 21, Display area 101, Frame area 102,
Gap region 103.

DESCRIPTION OF SPECIFIC EMBODIMENTS OF THE INVENTION

The following clearly and completely describes the technical solutions in the embodiments of the present disclosure with reference to the accompanying drawings in the embodiments of the present disclosure. Apparently, the described embodiments are merely some embodiments rather than all the embodiments of the present disclosure. All other embodiments obtained by a person skilled in the art based on the embodiments of the present disclosure without creative efforts shall fall within the protection scope of the present disclosure.

Figure 1B:
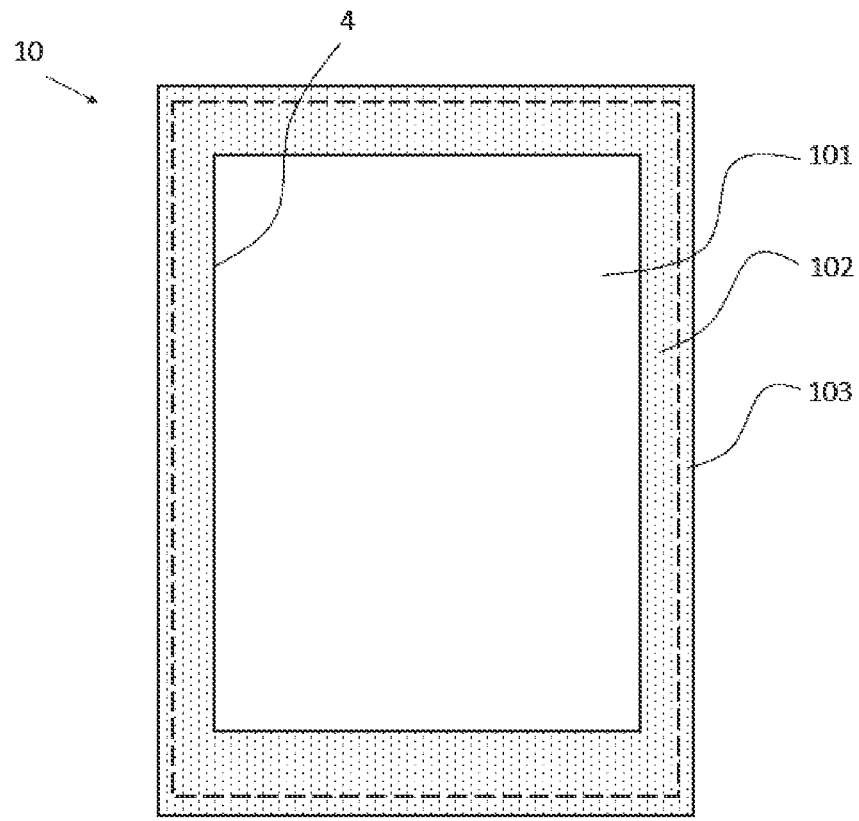
FIG. 1b is a schematic top view of a structure of an array base plate according to an embodiment of the present invention.
Figure 2:
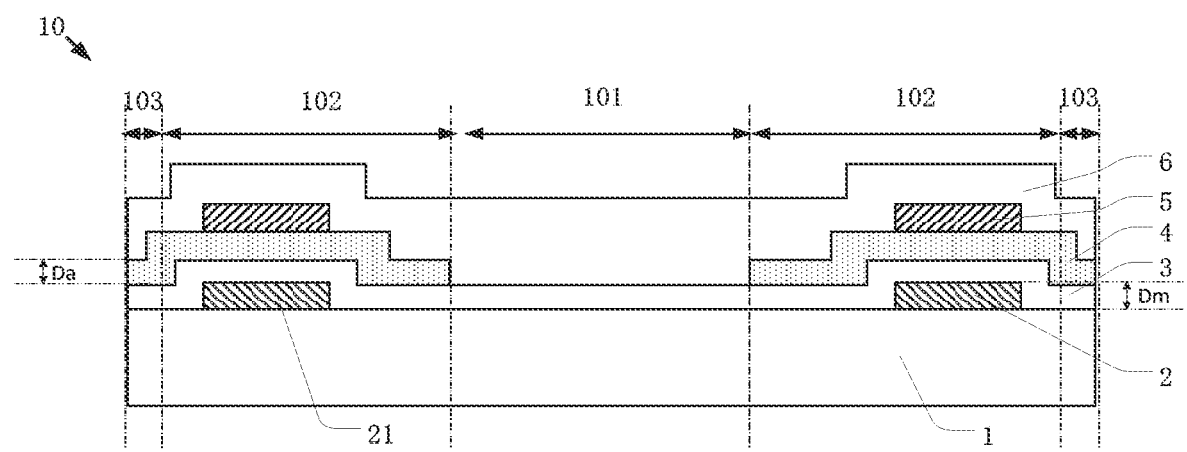
FIG. 2 is a schematic cross-sectional view of a structure of another array base plate according to an embodiment of the present invention.

As shown in FIGS. 1a, 1b, and 2, an embodiment of the present invention provides an array base plate 10. The array base plate 10 includes a substrate base plate layer 1, a first trace layer 2, an insulating layer 3, and a stress balance layer 4. The first trace layer 2 is disposed on the substrate base plate layer 1. The first trace layer 2 includes a first trace 21. The insulating layer 3 is disposed on the first trace layer 2 and covers the first trace 21. The stress balance layer 4 is disposed on the insulating layer 3 and surrounds an edge of the substrate base plate layer 1. An edge of the stress balance layer 4 is aligned to the edge of the substrate base plate layer 1. The stress balance layer 4 has a bending stress in a direction opposite to a direction of a bending stress of the first trace 21 and a curvature less than 1.2 mm/m. The bending stresses cancel each other out, thereby guaranteeing a straight structure of a manufactured array base plate 10.

In an embodiment of the present disclosure, the substrate base plate layer 1 is preferably a glass base plate or a structure including the glass base plate. A material of the first trace 21 includes Cu. A thickness Dm of the first trace 21 is greater than or equal to 5500 angstroms, and preferably, is in a range of 5500 angstroms to 15500 angstroms. A material of the insulating layer 3 includes silicon oxide and/or silicon nitride. A material of the stress balance layer 4 includes any of arsenic, polysilicon, SINx, SiQx, and IGZO. A thickness Da of the stress balance layer 4 is greater than or equal to 900 angstroms, and preferably, is in a range of 900 angstroms to 5600 angstroms. The stress balance layer 4 covers the first trace 21. When the material of the stress balance layer 4 is any of polysilicon, SINx, SiQx, and IGZO, an H content in the stress balance layer 4 formed by depositing the polysilicon, SINx, SiQx, or IGZO is lower than an H content of an active layer structure formed by a semiconductor layer prepared using a same material. In detail, a film layer is formed as a compressive stress by adjusting a temperature, the H content, a nitrogen-silicon ratio during preparation, such as reducing an $SiH_4$ flow rate, reducing an $NH_3$ flow rate, and increasing an $N_2$ flow rate. At present, a warping degree of the stress balance layer 4 is controlled below 1.2 mm. The warping degree (that is, a curvature) of the stress balance layer 4 is determined according to a toughness of the glass base plate in the substrate base plate layer 1 and a process device.

Figure 3:
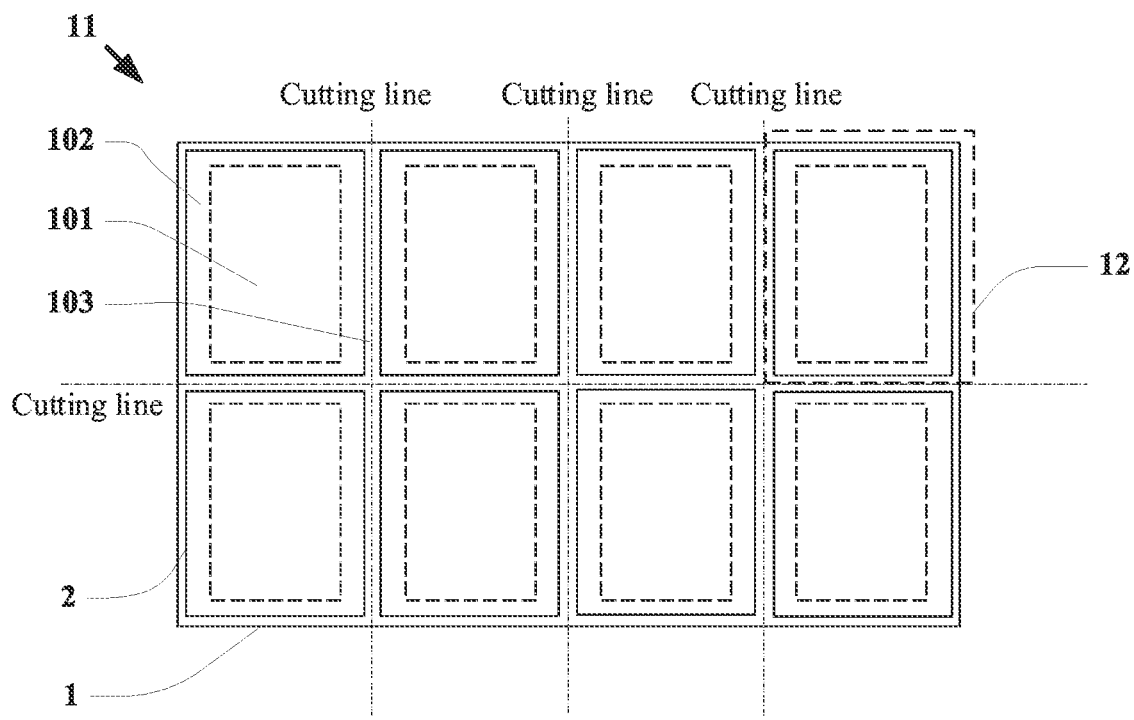
FIG. 3 is a schematic planar view of a structure before a large panel structure is cut into small panel structures to form an array base plate according to an embodiment of the present invention.
Figure 4:
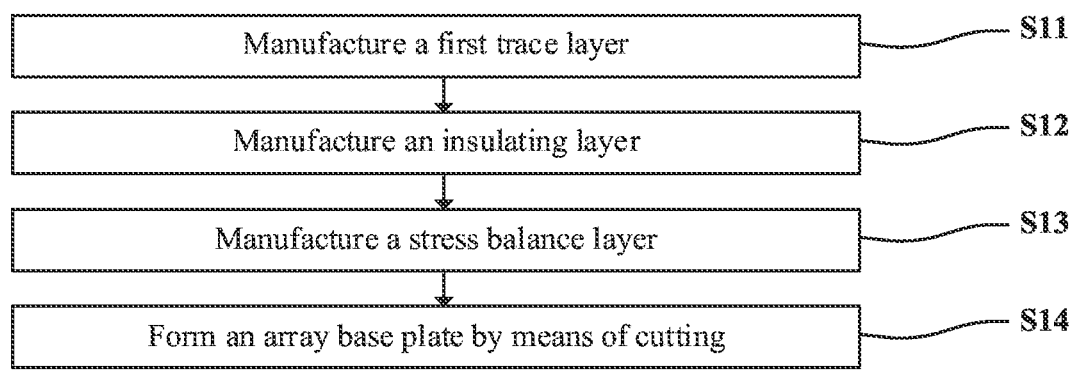
FIG. 4 is a flowchart of a method for manufacturing an array base plate according to an embodiment of the present invention.
Figure 5:
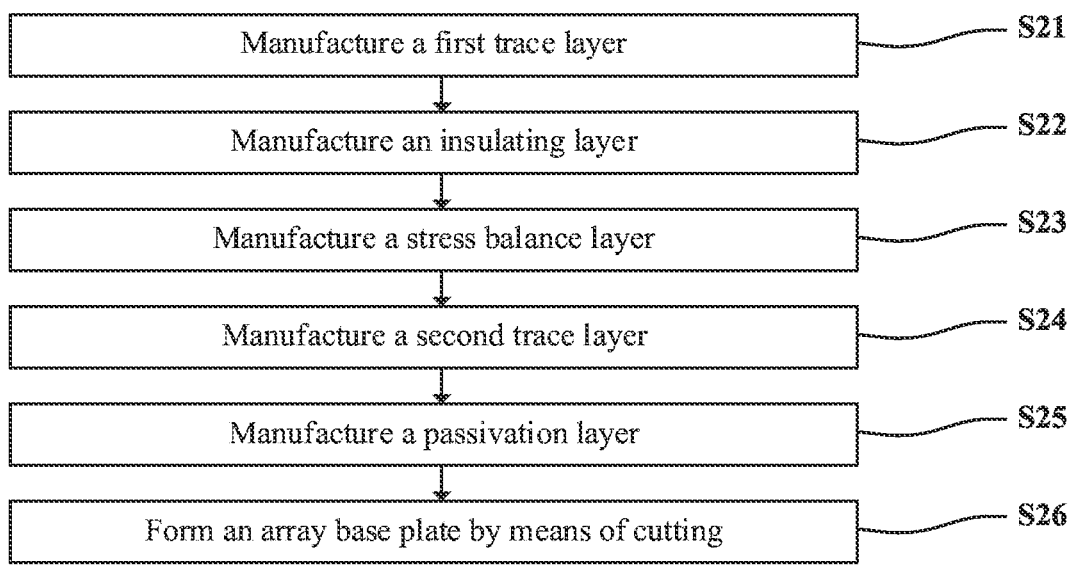
FIG. 5 is a flowchart of a method for manufacturing another array base plate according to an embodiment of the present invention.

As shown in FIGS. 1a and 2, the first trace 21 is preferably a gate trace (a scan line), and the insulating layer 3 is a gate insulating layer. As shown in FIG. 3, preferably, a large panel structure 11 for manufacturing the array base plate 10 includes a plurality of small panel structures 12. Each small panel structure 12 is cut out to form the array base plate 10 having a complete driving function. The array base plate 10 formed by each small panel structure 12 includes a display area 101 and a frame area 102 surrounding the display area 101. A gap region 103 is arranged between edge positions of two adjacent small panel structures 12. The large panel structure 11 has thereon cutting lines formed by cutting the gap regions 103, and is cut off to form the plurality of small panel structures 12. The stress balance layer 4 is disposed in the frame area 102.

The material of the first trace 21 is Cu. By means of analysis, a principle of the warping of the array base plate caused by a tensile stress of Cu is as follows. After a film is formed by using a Cu material by means of physical vapor deposition (PVD) and the first trace 21 is formed by means of patterning, a first trace 21 film and the substrate base plate layer 1 are transformed from a heated state to a cold state. The substrate base plate layer 1 includes glass. Since a thermal expansion coefficient of the glass is less than a thermal expansion coefficient of the Cu, the first trace 21 exerts a tensile stress to the substrate base plate layer 1, causing two ends of the substrate base plate layer 1 to be warped upward and bent. In case of an excessively large stress, the glass in the substrate base plate layer 1 is even broken. A thicker first trace 21 film layer brings a larger stress. Therefore, both the display area 10 and the frame area 102 of the array base plate prepared by using the glass are easily warped or even broken by a tensile stress of the first trace 21. Thus, in the present disclosure, the stress balance layer 4 is disposed on the first trace 21. By means of the compressive stress of the material of the stress balance layer 4, the tensile stress of the first trace 21 is balanced, thereby alleviating warping and breaking of the large panel structure 11 during the manufacturing of the array base plate 10.

As shown in FIG. 2, in an embodiment of the present disclosure, the array base plate 10 further includes a second trace layer 5 and a passivation layer 6. The second trace layer 5 is disposed on the stress balance layer 4. The second trace layer 5 is disposed corresponding to the first trace layer 2. The passivation layer 6 is disposed above the insulating layer 3 and covers the second trace layer 5. The second trace layer 5 is preferably a source/drain trace (a data line). A material of the second trace layer 5 includes Cu. A thickness the second trace layer 5 is greater than or equal to 5500 angstroms, and preferably, is in a range of 5500 angstroms to 15500 angstroms.

It may be understood that, another stress balance layer may be further disposed on the passivation layer 6 corresponding to a position of the second trace layer 5. The two stress balance layers can effectively enhance the stress balance effect for the array base plate, thereby effectively alleviating warping and breaking of the array base plate during preparation.

Referring to FIGS. 1a to 3 and 4, an embodiment of the present invention provides a method for manufacturing an array base plate. The method includes steps S11-S16.

S11: A step of manufacturing a first trace layer: manufacture a plurality of sets of same first trace layer patterns 2 on a substrate base plate layer 1 (a large panel structure 11), wherein each set of first trace layer patterns 2 includes a first trace 21, and the plurality of sets of first trace layer patterns 2 are arranged in an array and spaced apart from each other on the substrate base plate layer 1.

S12: A step of manufacturing an insulating layer: manufacture an insulating layer 3 to cover the plurality of sets of first trace layer 2 patterns and the substrate base plate layer 1.

S13: A step of manufacturing a stress balance layer: manufacture a stress balance layer 4 on the insulating layer 3, wherein the stress balance layer 4 covers gap regions 103 among the plurality of sets of first trace layer 2 patterns. When a material of the stress balance layer 4 is any of polysilicon, SINx, SiQx, and IGZO, an H content in the stress balance layer 4 formed by depositing the polysilicon, SINx, SiQx, or IGZO is lower than an H content of an active layer structure formed by a semiconductor layer prepared using a same material. In detail, a film layer is formed as a compressive stress by adjusting a temperature, the H content, a nitrogen-silicon ratio during preparation, such as reducing an $SiH_4$ flow rate, reducing an $NH_3$ flow rate, and increasing an $N_2$ flow rate. At present, a warping degree of the stress balance layer 4 is controlled below 1.2 mm. The warping degree (that is, a curvature) of the stress balance layer 4 is determined according to a toughness of the glass base plate in the substrate base plate layer 1 and a process device.

S14: A step of forming an array base plate by means of cutting: cut the substrate base plate layer 1 (the large panel structure 11) along the gap regions 103 to form a plurality of array base plates 10.

Referring to FIGS. 1a to 3 and 5, still another embodiment of the present invention provides a method for manufacturing an array base plate. The method includes steps S21-S26:

S21: A step of manufacturing a first trace layer: manufacture a plurality of sets of same first trace layer patterns 2 on a substrate base plate layer 1 (a large panel structure 11), wherein each set of first trace layer patterns 2 includes a first trace 21, and the plurality of sets of first trace layer patterns 2 are arranged in an array and spaced apart from each other on the substrate base plate layer 1.

S22: A step of manufacturing an insulating layer: manufacture an insulating layer 3 to cover the plurality of sets of first trace layer 2 patterns and the substrate base plate layer 1.

S23: A step of manufacturing a stress balance layer: manufacture a stress balance layer 4 on the insulating layer 3, wherein the stress balance layer 4 covers gap regions 103 among the plurality of sets of first trace layer 2 patterns.

S24: A step of manufacturing a second trace layer: manufacture a second trace layer pattern 5 on the stress balance layer 4.

S25: A step of manufacturing a passivation layer: manufacture a passivation layer 6 on the second trace layer pattern 5.

S26: A step of forming an array base plate by means of cutting: cut the substrate base plate layer 1 (the large panel structure 11) along the gap regions 103 to form a plurality of array base plates 10.

In the array base plates 10 obtained by means of cutting, the stress balance layer 4 is disposed on the insulating layer 3 and surrounds an edge of the substrate base plate layer 1. An edge of the stress balance layer 4 is aligned to the edge of the substrate base plate layer 1. The stress balance layer 4 has a bending stress in a direction opposite to a direction of a bending stress of the first trace 21. The bending stresses cancel each other out, thereby guaranteeing a straight structure of the manufactured array base plates 10.

In an embodiment of the present disclosure, the substrate base plate layer 1 is preferably a glass base plate or a structure including the glass base plate. A material of the first trace 21 includes Cu. A thickness Dm of the first trace 21 is greater than or equal to 5500 angstroms, and preferably, is in a range of 5500 angstroms to 15500 angstroms. A material of the insulating layer 3 includes silicon oxide and/or silicon nitride. A thickness Da of the stress balance layer 4 is greater than or equal to 900 angstroms, and preferably, is in a range of 900 angstroms to 5600 angstroms. The stress balance layer 4 covers the first trace 21. When a material of the stress balance layer 4 is any of polysilicon, SINx, SiQx, and IGZO, an H content in the stress balance layer 4 formed by depositing the polysilicon, SINx, SiQx, or IGZO is lower than an H content of an active layer structure formed by a semiconductor layer prepared using a same material. In detail, a film layer is formed as a compressive stress by adjusting a temperature, the H content, a nitrogen-silicon ratio during preparation, such as reducing an $SiH_4$ flow rate, reducing an $NH_3$ flow rate, and increasing an $N_2$ flow rate. At present, a warping degree of the stress balance layer 4 is controlled below 1.2 mm. The warping degree (that is, a curvature) of the stress balance layer 4 is determined according to a toughness of the glass base plate in the substrate base plate layer 1 and a process device.

As shown in FIG. 3, a large panel structure 11 before cutting for manufacturing the array base plate 10 includes a plurality of small panel structures 12. Each small panel structure 12 is cut out to form the array base plate 10 having a complete driving function. The array base plate 10 formed by each small panel structure 12 includes a display area 101 and a frame area 102 surrounding the display area 101. A gap region 103 is arranged between edge positions of two adjacent small panel structures 12. The large panel structure 11 has thereon cutting lines formed by cutting the gap regions 103, and is cut off to form the plurality of small panel structures 12. The stress balance layer 4 is disposed in the frame area 102.

The material of the first trace 21 is Cu. By means of analysis, a principle of the warping of the array base plate caused by a tensile stress of Cu is as follows. After a film is formed by using a Cu material by means of physical vapor deposition (PVD) and the first trace 21 is formed by means of patterning, a first trace 21 film and the substrate base plate layer 1 are transformed from a heated state to a cold state. The substrate base plate layer 1 includes glass. Since a thermal expansion coefficient of the glass is less than a thermal expansion coefficient of the Cu, the first trace 21 exerts a tensile stress to the substrate base plate layer 1, causing two ends of the substrate base plate layer 1 to be warped upward and bent. In case of an excessively large stress, the glass in the substrate base plate layer 1 is even broken. A thicker first trace 21 film layer brings a larger stress. Therefore, both the display area 101 and the frame area 102 of the array base plate 10 prepared by using the glass are easily warped or even broken by a tensile stress of the first trace 21. Thus, in the present disclosure, the stress balance layer 4 is disposed on the first trace 21. By means of the compressive stress of the material of the stress balance layer 4, the tensile stress of the first trace 21 is balanced, thereby alleviating warping and breaking of the large panel structure 11 during the manufacturing of the array base plate 10.

It may be understood that, another stress balance layer may be further disposed on the passivation layer 6 corresponding to a position of the second trace layer 5. The two stress balance layers can effectively enhance the stress balance effect for the array base plate 10, thereby effectively alleviating warping and breaking of large panel structure 11 during preparation of the array base plate 10.

Beneficial effects of the present invention are as follows. An array base plate and a manufacturing method therefor are provided. The stress balance layer is disposed in the gap regions and the frame area or on the first trace and/or the second trace. By means of a compressive stress of the material of the stress balance layer, a tensile stress is balanced, thereby alleviating warping and breaking of the array base plate during preparation.

The foregoing descriptions are exemplary implementations of the present invention. It should be noted that a person of ordinary skill in the art may make some improvements and modifications without departing from the principle of the present invention, and such improvements and modifications shall fall within the protection scope of the present invention.

What is claimed is:

1. An array base plate, comprising:
   a substrate base plate layer;
   a first trace layer, disposed on the substrate base plate layer and comprising a first trace;
   an insulating layer, disposed on the first trace layer and covering the first trace; and
   a stress balance layer, disposed on the insulating layer and surrounding an edge of the substrate base plate layer, wherein an edge of the stress balance layer is aligned to the edge of the substrate base plate layer, and the stress balance layer has a bending stress in a direction opposite to a direction of the first trace and a curvature less than 1.2 mm/m.

2. The array base plate as claimed in claim 1, wherein a material of the first trace layer comprises copper (Cu).

3. The array base plate as claimed in claim 1, wherein a thickness of the first trace is greater than or equal to 5500 angstroms.

4. The array base plate as claimed in claim 1, wherein a material of the stress balance layer comprises any of arsenic, polysilicon, SINx, SiQx, and IGZO.

5. The array base plate as claimed in claim 1, wherein a thickness of the stress balance layer is greater than or equal to 900 angstroms.

6. The array base plate as claimed in claim 1, wherein the stress balance layer covers the first trace.

7. The array base plate as claimed in claim 6, wherein the array base plate is divided into a display area and a frame area surrounding the display area, and the stress balance layer is disposed in the frame area.

8. The array base plate as claimed in claim 7, further comprising:
   a second trace layer, disposed on the stress balance layer; and
   a passivation layer, disposed on the second trace layer.

9. The array base plate as claimed in claim 8, wherein a material of the second trace layer comprises Cu.

10. The array base plate as claimed in claim 8, wherein a thickness of the second trace is greater than or equal to 5500 angstroms.

11. A method for manufacturing an array base plate, the method comprising steps of:
    manufacturing a plurality of sets of same first trace layer patterns on a substrate base plate layer, wherein each set of first trace layer patterns comprises a first trace, and the plurality of sets of first trace layer patterns are arranged in an array and spaced apart from each other on the substrate base plate layer;
    manufacturing an insulating layer to cover the plurality of sets of first trace layer patterns and the substrate base plate layer;
    manufacturing a stress balance layer on the insulating layer, wherein the stress balance layer covers gap regions among the plurality of sets of first trace layer patterns and has a bending stress in a direction opposite to a direction of the first trace and a curvature less than 1.2 mm/m; and
    cutting the substrate base plate layer along the gap regions to form a plurality of array base plates.

12. The method for manufacturing an array base plate as claimed in claim 11, wherein a material of the first trace layer comprises Cu.

13. The method for manufacturing an array base plate as claimed in claim 11, wherein a thickness of the first trace is greater than or equal to 5500 angstroms.

14. The method for manufacturing an array base plate as claimed in claim 11, wherein a material of the stress balance layer comprises any of arsenic, polysilicon, SINx, SiQx, and IGZO.

15. The array base plate as claimed in claim 11, wherein a thickness of the stress balance layer is greater than or equal to 900 angstroms.

16. The method for manufacturing an array base plate as claimed in claim 11, wherein the stress balance layer covers the first trace.

17. The method for manufacturing an array base plate as claimed in claim 11, the method further comprising:
   manufacturing a second trace layer on the stress balance layer; and
   manufacturing a passivation layer on the second trace layer.

18. The array base plate as claimed in claim 17, wherein a material of the second trace layer comprises Cu, and a thickness of the second trace is greater than or equal to 5500 angstroms.

19. A method for manufacturing an array base plate, the method comprising steps of:
   manufacturing a plurality of sets of same first trace layer patterns on a substrate base plate layer, wherein each set of first trace layer patterns comprises a first trace, and the plurality of sets of first trace layer patterns are arranged in an array and spaced apart from each other on the substrate base plate layer;
   manufacturing an insulating layer to cover the plurality of sets of first trace layer patterns and the substrate base plate layer;
   manufacturing a stress balance layer on the insulating layer, wherein the stress balance layer covers gap regions among the plurality of sets of first trace layer patterns and has a bending stress in a direction opposite to a direction of the first trace and a curvature less than 1.2 mm/m;
   manufacturing a second trace layer pattern on the stress balance layer;
   manufacturing a passivation layer on the second trace layer pattern; and
   cutting the substrate base plate layer along the gap regions to form a plurality of array base plates.

20. The method for manufacturing an array base plate as claimed in claim 19, wherein the array base plate is divided into a display area and a frame area surrounding the display area, and the stress balance layer covers a range from the gap regions to the frame area.

\* \* \* \* \*